United States Patent
Lee (10) Patent No.: US 8,797,203 B2
(45) Date of Patent: Aug. 5, 2014

(54) LOW-POWER HIGH-RESOLUTION TIME-TO-DIGITAL CONVERTER

(71) Applicant: Electronics and Telecommunications Research Institute, Daejeon (KR)

(72) Inventor: Ja Yol Lee, Chungcheongnam-do (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/743,711

(22) Filed: Jan. 17, 2013

(65) Prior Publication Data

US 2013/0214959 A1  Aug. 22, 2013

(30) Foreign Application Priority Data

Feb. 16, 2012 (KR) .................. 10-2012-0015695

(51) Int. Cl.
*H03M 1/50* (2006.01)

(52) U.S. Cl.
USPC .......................................... 341/166; 341/155

(58) Field of Classification Search
USPC .................................................. 341/155, 166
See application file for complete search history.

(56) References Cited

U.S. PATENT DOCUMENTS

| 7,813,462 B2 * | 10/2010 | de Obaldia et al. ........... 375/376 |
| 7,973,578 B2 * | 7/2011 | Oh et al. ....................... 327/158 |
| 8,106,808 B1 * | 1/2012 | Cohen et al. .................. 341/166 |
| 2003/0141936 A1 | 7/2003 | Staszewski et al. |

FOREIGN PATENT DOCUMENTS

KR  10-2010-0130205 A  12/2010

OTHER PUBLICATIONS

Hsiang-Hui Chang et al., "A 320fs-RMS-Jitter and 300kHz-BW All-Digital Fractional-N PLL with Self-Corrected TDC and Fast Temperature Tacking Loop for WiMax/WLAN 11n", 2009 Symposium on VLSI Circuits Digest of Technical Papers, Jun. 16-18, 2009, pp. 188-189.

Takashi Tokairin et al., "A 2.1-to-2.8-GHz Low-Phase-Noise All-Digital Frequency Synthesizer With a Time-Windowed Time-to-Digital Converter", IEEE Journal of Solid-State Circuits, Dec. 2010, pp. 2582-2590, vol. 45, No. 12.

V. Ramakrishnan et al., "A Wide-Range, High-Resolution, Compact, CMOS Time to Digital Converter", Proceedings of the 19th International Conference on VLSI Design, Jan. 3-7, 2006, pp. 197-202.

* cited by examiner

*Primary Examiner* — Khai M Nguyen
(74) *Attorney, Agent, or Firm* — Rabin & Berdo, P.C.

(57) ABSTRACT

Disclosed is a low-power and high-resolution time-to-digital converter including: a coarse delay cell configured to delay a reference clock by a coarse delay time and output the reference clock; a rising-edge retimer configured to output a rising-edge retimed clock synchronized with the rising-edge of a DCO clock in response to the reference clock; a falling-edge retimer configured to output a falling-edge retimed clock synchronized with the falling-edge of the DCO clock; a first sampler configured to latches output of the coarse delay cell in response to the rising-edge retimed clock and the falling-edge retimed clock; and a pseudo-thermometer code edge detector configured to detect a rising-edge fractional phase error between the reference clock and the rising-edge retimed clock as a coarse phase error from a signal output by the first sampler, and detect a falling-edge fractional phase error between the reference clock and the falling-edge retimed clock.

8 Claims, 4 Drawing Sheets

LOW-POWER HIGH-RESOLUTION TIME-TO-DIGITAL CONVERTER

CROSS-REFERENCES TO RELATED APPLICATIONS

The present application claims priority under 35 U.S.C 119(a) to Korean Application No. 10-2012-0015695, filed on Feb. 16 2012, in the Korean Intellectual Property Office, which is incorporated herein by reference in its entirety set forth in full.

BACKGROUND

Exemplary embodiments relate to a low-power and high-resolution time-to-digital converter, and more particularly, to a low-power and high-resolution time-to-digital converter configured to detect a phase error between a retimed reference clock and a reference clock.

A charge pump PPL (Phase Locked Loop) has been generally used to design RF frequency synthesizer for multiband mobile communication in the related art and analog circuit design technologies are integrated in the charge pump PPL. Accordingly, a specific additional analog/RF library is required, other than an analog circuit and a design library that is provided in a standard digital CMOS process due to analog signal characteristics, so that it is difficult to integrate with a digital baseband signal processing block.

Further, as a nanoscale digital CMOS process has been recently developed, digital baseband signal processing blocks have also been increasingly developed by using the nanoscale digital CMOS process. With the change of development of the nanotechnology, digital circuits can be implemented by being easily adopted t a process technology for desired manufacturing, substantially without redesigning, but there is a problem in that it is necessary to redesign the analogy/RF integrated circuit every time the process technology is changed, and there is a defect in that an operation voltage decreases, as the CMOS process technology is correspondingly developed into the nanoscale.

Therefore, it takes a lot of time and cost to improve various problems in designing the analog/RF integrated circuit in the nanoscale digital CMOS process, so that researches about digital RF that gradually digitalizes the analog/RF circuit have been intensively conducted. In particular, the frequency synthesizer in the RF transceivers is a part that can be completely digitalized. Although the digital PLL frequency synthesizer has a long history, but the phase noise and the jitter characteristics are poor, so that the digital PLL frequency synthesizer has not been substantially used for the local oscillator of RF transceiver for mobile communication that requires high-quality phase noise.

However, a new type of ADPLL (all digital PLL) was developed a few years ago by applying the digital PLL technology to a frequency synthesizer for mobile communication. The difference between the ADPLL and the digital PLL of the related art is the DCO (Digitally Controlled Oscillator), and the past DCO oscillator of the related art is implemented by using a digital logic but the recent DCO oscillator is implemented by using an LC resonator. Therefore, since the DCO is designed by using an LC resonator, the phase noise or the jitter noise is very excellent more than the DCO using the past digital logic.

Since the DCO oscillator using an LC resonator controls the oscillation frequency by controlling a fine amount of change in capacitance of the LC resonator, the capacitor bank is divided into a coarse control bank and a fine control bank. The coarse control bank of the DCO is used to quickly find a PLL lock for a desired PLL frequency and is converted into the fine control bank by a mode conversion signal when the objective PLL frequency is almost reached by the coarse control bank, in which the fine control bank is used and the objective PLL frequency is locked by fine tracking.

The fractional phase error $\epsilon$ that is used for the fine tracking is generated by a time-to-digital converter a fine phase difference between the reference signal and DCO output signal is compensated through an arithmetical operation phase detector by a fractional phase error signal.

In this case, the phase noise performance of the existing digital PLL is determined by the resolution of the fractional phase error $\epsilon$ that the time-to-digital converter can detect. That is, the higher the detected resolution of the fractional phase error $\epsilon$ of the time-to-digital converter, the more the phase noise becomes good, and the phase error detection resolution is determined by the minimum inverter delay time of an inverter chain constituting the time-to-digital converter. However, as disclosed in Korean Patent Publication No. 2010-0130205, the inverter chain of time-to-digital converters that has been invented before has a defect in that power consumption and noise contribution are large, because the inverter chain should operate at a high DCO clock frequency.

The technical field of the present invention is disclosed in a 'high-speed time-digital converter' disclosed in Korean Patent Publication No. 10-2010-0130205 (Dec. 10, 2010).

SUMMARY

An embodiment of the present invention is directed to provide a low-power and low-noise time-to-digital converter configured to have power consumption and noise contribution which are significantly smaller than those of the existing time-to-digital converters by operating the frequency of a reference clock, and to be able to be used for a low-power and low-nose frequency synthesizer that can be provided for a mobile communication terminal under severe regulations because noise is reduced by using a delay cell with a small delay time.

Further, another embodiment of the present invention is directed to improve phase error detection resolution by being divided into a coarse delay cell and a fine delay cell such that a phase error is coarsely detected in a detection mode using the coarse cell and a residual phase error or residue time in a detection mode using the fine delay cell.

An embodiment of the present invention relates to A low-power and high-resolution time-to-digital converter including: a coarse delay cell configured to delay a reference clock by a coarse delay time and output the reference clock; a rising-edge retimer configured to output a rising-edge retimed clock synchronized with the rising-edge of a DCO clock in response to the reference clock; a falling-edge retimer configured to output a falling-edge retimed clock synchronized with the falling-edge of the DCO clock; a firs sampler configured to latches output of the coarse delay cell in response to the rising-edge retimed clock and the falling-edge retimed clock; and a pseudo-thermometer code edge detector configured to detect a rising-edge fractional phase error $\epsilon_c$ between the reference clock and the rising-edge retimed clock as a coarse phase error from a signal output by the first sampler, and detect a falling-edge fractional phase error $\Delta\tau_N$ between the reference clock and the falling-edge retimed clock.

The first sampler includes a plurality of D-flip-flops each responding to the rising-edge retimed clock and the falling-edge retimed cloak, and the pseudo-thermometer code edge detector converts the rising-edge fractional phase error $\epsilon_c$ and the falling-edge fractional phase error $\Delta\tau_N$ into digital code values corresponding to the number of D-flip-flops that have latched in the plurality of D-flip-flops.

The pseudo-thermometer code edge detector generates a selection signal showing a residual time detection time point by using the rising-edge fractional phase error $\epsilon_c$ and the falling-edge fractional phase error $\Delta\tau_N$.

The low-power high-resolution time-to-digital converter further includes residual error detector configured to detect a fine phase error $\epsilon_r$ between the reference clock and the rising-edge retimed clock at the time point where the selection signal is generated.

The residual error detector includes: a coarse delay time detector configured to detect the coarse delay time by using the reference clock and a reference clock delayed by a coarse delay time of the coarse delay cell; and a residual time detector configured to detect a residual time difference between the reference clock and the rising-edge retimed clock, in which the residual error detector regulates the residual time to the coarse delay time.

The residual time detector detects the residual time from the time point where the selection signal is input from the pseudo-thermometer code edge detector.

The residual error detector includes a coarse delay time and residual time detector provided with a built-in pseudo-thermometer code configured to calculate first the coarse delay time and then calculate the residual time or simultaneously calculate the coarse delay time and the residual time in accordance with the logic state of the selection signal showing the detection time point of the residual time.

The low-power high-resolution time-to-digital converter further includes: a DCO cycle detector configured to calculate a DCO clock cycle by detecting a difference between the rising-edge fractional phase error and the falling-edge fractional phase error; and a regulating block configured to regulate a fractional phase error obtained by adding the coarse phase error to the fine phase error by using the DCO clock signal.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, a low-power and high-resolution time-to-digital converter in accordance with an embodiment of the present invention will be described in detail with reference to the accompanying drawings. The thicknesses of lines or sizes of components illustrated in the drawings may be exaggerated for the clarity and convenience of the following description. Further, the terminologies described below are terminologies determined in consideration of the functions in the present invention and may be construed in different ways by the intention of users and operators. Therefore, the definitions of the thereof should be construed based on the contents throughout the specification.

Figure 1:
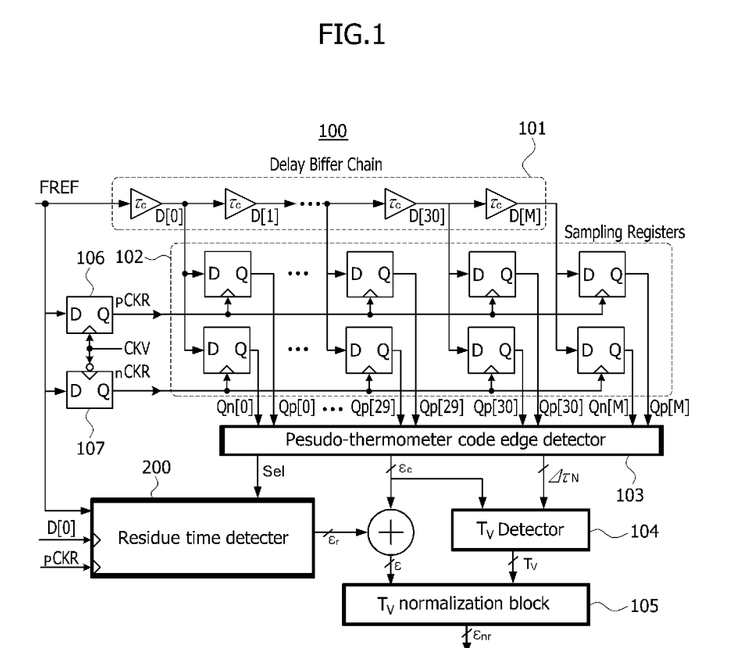
FIG. 1 is a configuration block diagram of a time-to-digital converter in accordance with an embodiment of the present invention.
Figure 2:
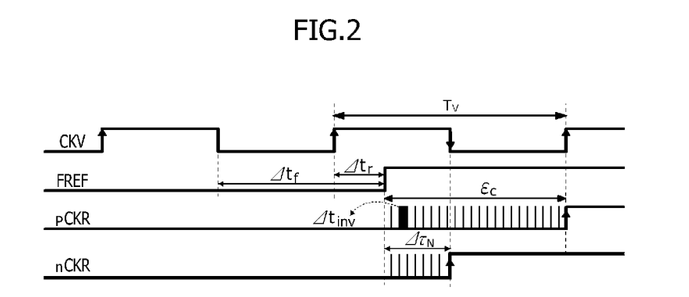
FIG. 2 is a diagram illustrating the operational principle of input/output clocks of a rising-edge retimer and a falling-edge retimer of a DCO.
Figure 3:
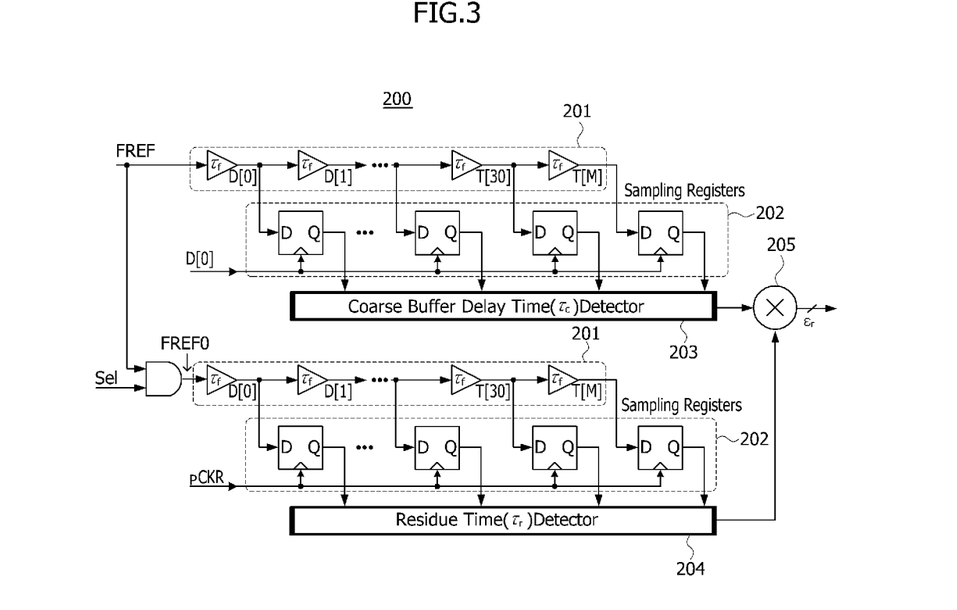
FIG. 3 is a diagram illustrating an example of a configuration diagram of a residual error detector in accordance with an embodiment of the present invention.
Figure 4:
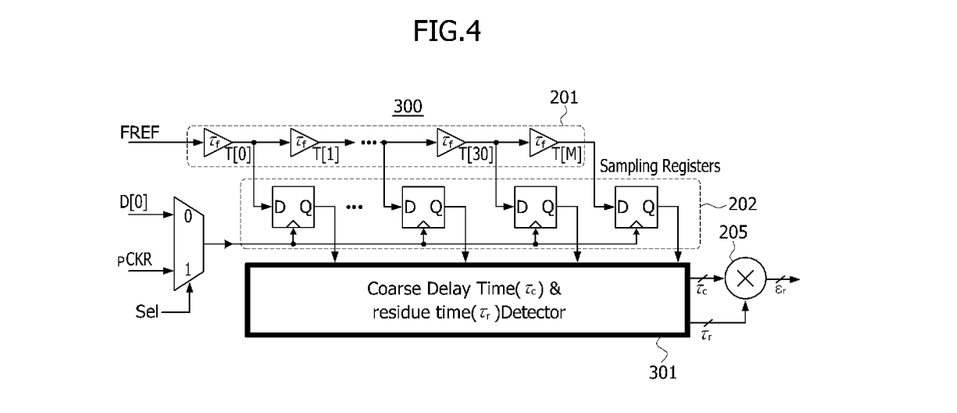
FIG. 4 is a diagram illustrating another example of a configuration diagram of a residual error detector in accordance with an embodiment of the present invention.
Figure 5:
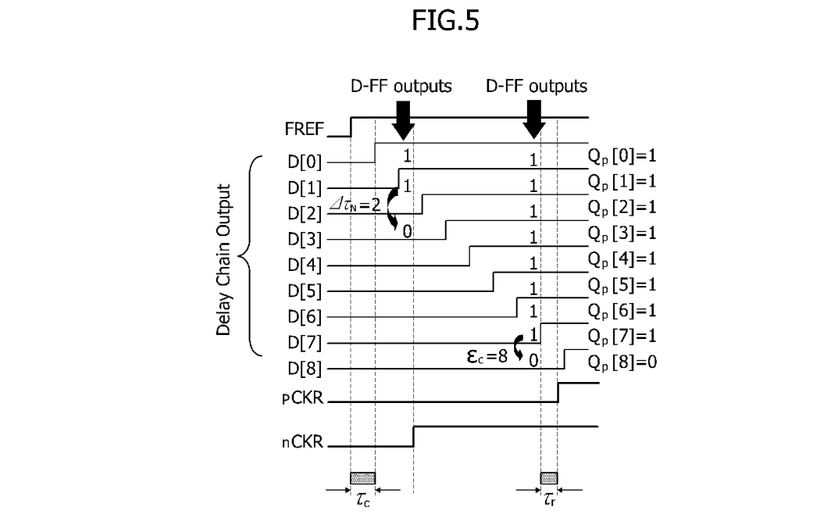
FIG. 5 illustrates waveforms showing a phase error detection method of a time-to-digital converter in accordance with an embodiment of the present invention.
Figure 6:
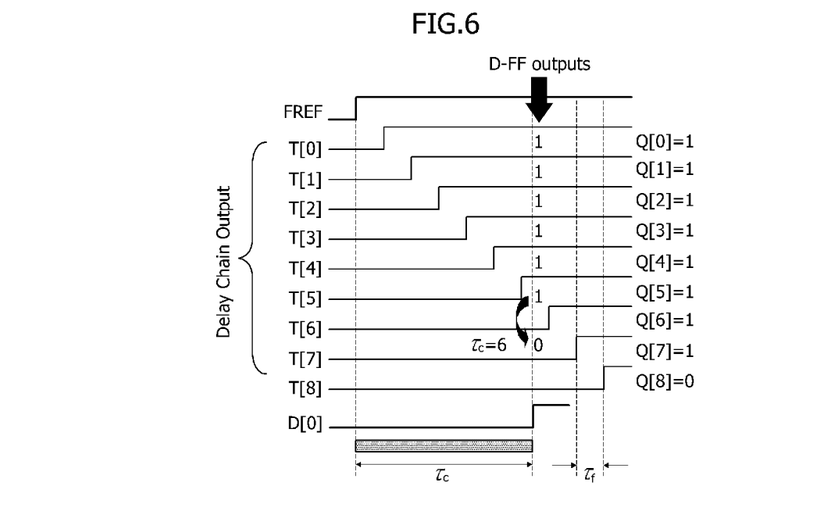
FIG. 6 illustrates waveforms showing a coarse delay time detection method of a residual effort detector in accordance with an embodiment of the present invention.
Figure 7:
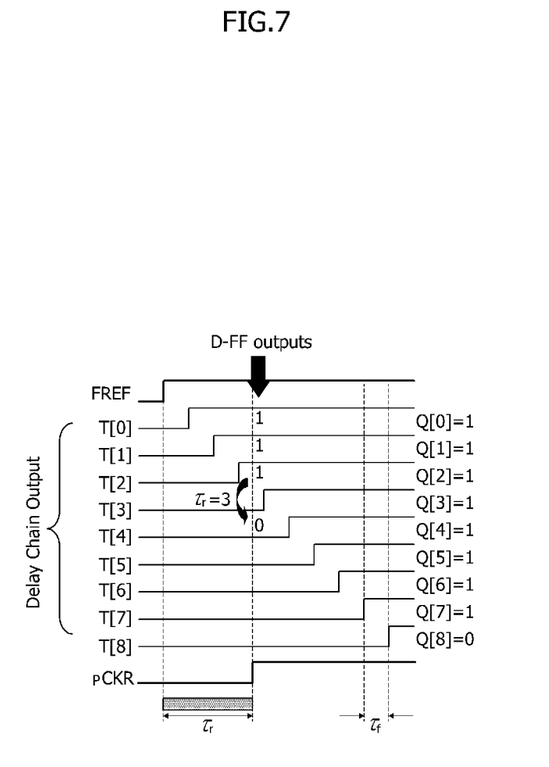
FIG. 7 illustrates waveforms showing a residue time detection method of a residual effort detector in accordance with an embodiment of the present invention.

FIG. 1 is a configuration block diagram of a time-to-digital converter in accordance with an embodiment of the present invention, FIG. 2 is a diagram illustrating the operational principle of input/output clocks of a rising-edge retimer and a falling-edge retimer of a DCO, FIG. 3 is a diagram illustrating an example of a configuration diagram of a residual error detector in accordance with an embodiment of the present invention, FIG. 4 is a diagram illustrating another example of a configuration diagram of a residual error detector in accordance with an embodiment of the present invention, FIG. 5 illustrates waveforms showing a phase error detection method of a time-to-digital converter in accordance with an embodiment of the present invention, FIG. 6 illustrates waveforms showing a coarse delay time detection method of a residual effort detector in accordance with an embodiment of the present invention, and FIG. 7 illustrates waveforms showing a residue time detection method of a residual effort detector in accordance with an embodiment of the present invention.

A time-to-digital converter according to an embodiment of the present invention is configured to be used for a digital PLL (Phase Locked Loop) that is used for wire/wireless communication devices and to arranging the phase of a DCO signal to a reference signal phase by detecting a fractional phase error between the output signal phase and a reference FREF phase of an DCO (Digitally-Controlled Oscillator) and transmitting the fractional phase error as a digital code output value to an arithmetical operation phase error detector.

A time-to-digital converter 100 according to an embodiment of the present invention functions to reduce inband noise simultaneously with locking at a desired frequency by detecting a time error between the reference signal FREF and a rising-edge retimed signal pCKR and compensating for the time error through a PLL loop.

In the time-to-digital converter 100, the reference signal FREF and the rising-edge retimed signal pCKR obtained by synchronizing the frequency of the reference signal FREF to the frequency of a DCO output signal CKV are input to the time-to-digital converter 100, thereby detecting the phase difference between the retimed signal and the reference signal and outputting the phase difference as a digital code value. The digital output value is input to the arithmetical operation phase detector and the phase error corresponding to the phase difference between the reference signal FREF and the DCO output signal CKV is output as a digital value through an arithmetic operation. The digital phase error value of the arithmetic operation phase detector is input and filtered in a digital loop filter, and is then converted into a refined digital code value for controlling a varactor of the DCO. Since the digital code value output from the digital loop filter corresponds to the phase between the DCO output signal and the reference signal, when the digital code value is input to the DCO, the frequency of the DCO output signal which corresponds to the phase error changes.

The output signal of the DCO with the changed frequency is fedback to the input of the time-to-digital converter 100 and the output signal phase of the DCO is counted, and the counted value is input to the arithmetical operation phase detector and a phase error between the two signals is generated by arithmetically operating with the phase value of the reference signal FREF. The digital PLL tracks the phase error through the PLL loop by repeating the process until the phase error between the DCO output signal CKV and the reference signal FREF becomes zero. When the phase error of the digital PLL is zero, the loop of the digital PLL is locked.

The time-to-digital converter 100 according to the present embodiment includes a residual error detector 200 to increase the detection resolution of the phase error and the residual error detector 200 includes a delay cell having a delay time smaller than the delay time $\tau_c$ of the coarse delay cell 101. Since the delay time $\tau_f$ of the delay cell included in the residual error detector 200 is very smaller than the delay time $\tau_c$ of the coarse delay cell, so that it is possible to improve the inband noise of the digital PLL by increasing the resolution noise for the phase error.

Referring to FIG. 1, the time-to-digital converter 100 according to an embodiment of the present invention includes a coarse delay cell 101, a first sampler 102, a pseudo thermometer code edge detector 103, a DCO cycle detector 104, a normalizing block 105, a rising-edge retimer 106, a falling-edge retimer 107, and a residual error detector 200.

The inverter in the coarse delay cell 101, having a predetermined delay time $\tau_c$ is constituted by a delay buffer chain connected with a plurality of (M in the present embodiment) delay buffers (delay cells) in series, and the coarse delay cell 101 outputs signals D[0]~D[M] delayed by a predetermined delay time (one delay buffer time) to the reference clock FREF by receiving the reference signal FREF and sequentially passing the delay buffers.

The first sampler 102 is a sampling register and includes a plurality of flap-flops that latches the outputs D[0]~D[M] of the delay cells. The plurality of flip-flops may each be implemented by a D-flip-flop and are composed of two times the number of the inverters included in the coarse delay cell 101, that is, 2M D-flip-flops.

The M D-flip-flops of the first group output signals Qp[0]~Qp[M] for detecting rising-edge fractional phase errors by performing a latching operation in response to a rising-edge timed clock pCKR that is describe below and the M D-flip-flops of the second group output signals Qn[0]~Qn[M] for detecting falling-edge fractional phase errors by performing a latching operation in response to a falling-edge retimed clock nCKR that is described below.

The rising-edge retimer 106 is a D-flip-flop configured to provide the rising-edge retimed clock pCKR synchronized with the rising-edge of a DCO clock to the D-flip-flops of the first group of the first sampler 102, as a clock pulse, in response to the reference clock FERF that is an input signal.

The falling-edge retimer 107 is a D-flip-flop configured to provide the falling-edge retimed clock pCKR synchronized with the falling-edge of a DCO clock CKV to the D-flip-flops of the second group of the first sampler 102, as a clock pulse, in response to the reference clock FERF that is an input signal.

The pseudo-thermometer code edge detector 103 receives a signal for detecting a rising-edge fractional phase error and a signal for detecting a falling-edge phase error and detects a rising-edge fractional phase error $\epsilon_c$ that is the phase difference between the reference clock and the rising-edge retimed clock and a falling-edge fractional phase error $\Delta\tau_N$ that is the phase difference between the reference clock and the falling-edge retimed clock. Here, the rising-edge fractional phase error $\epsilon_c$ corresponds to the coarse phase error. Further, the pseudo-thermometer code edge detector 103 also outputs a selection signal Sel that shows the detection time point of a residue time and will be used by a residual error detector 200.

The residual error detector 200 receives the reference clock FREF, the reference clock D[0] delayed for one delay time, the rising-edge retimed clock pCKR, and the selection signal Sel, and detects the residual phase error $\epsilon_r$. Here, the residual phase error $\epsilon_r$ corresponds to the fine phase error.

It becomes possible to calculate a fractional phase error $\epsilon$ by adding the fine phase error $\epsilon_r$ detected by the residual error detector 200 and the coarse phase error $\epsilon_c$ detected by the pseudo-thermometer code edge detector 103, the fractional phase error $\epsilon$ is input to the normalizing block 105.

The DCO cycle detector 104 calculates a DCO clock cycle $T_v$ by receiving the rising-edge fractional phase error $\epsilon_c$ and the falling-edge fractional phase error $\Delta\tau_N$ from the pseudo-thermometer code edge detector 103.

The normalizing block 105 can output the phase error $\epsilon nr$ normalized by using the fractional phase error $\epsilon$ and the DCO clock cycle $T_v$.

In the present embodiment, the time-to-digital converter 100 outputs a digitized value by comparing the phase differences between the reference clock FREF and the rising-edge retimed clock pCKR. The reference clock FREF is input to the coarse delay cell 101 and the rising-edge retimed clock pCKR is input to the first sampler 102, such that the phase difference between two signals are converted into a digital value by sampling the phase of the reference clock delayed by the coarse delay cell 11 with the rising-edge retimed clock. In order to make the digital phase error value between the reference clock converted into a digital value and the rising-edge retimed clock a decimal value, the digital phase error value is divided by the DCO clock cycle $T_v$ to be converted into a 15 bit decimal value and input to the phase error detector.

In detail, the falling-edge retimed clock nCKR is used to calculate the DCO clock cycle and the detection resolution of the phase error $\epsilon$ is increased by detecting the reference clock and the fine phase error $\epsilon_r$ of the rising-edge retimed clock with the residual error detector 200 and adding the coarse phase error $\epsilon_c$ to them, thereby reducing the inband noise of the digital PLL.

For example, the digital loop filter of the digital PLL scales down the 23-bit digital phase error signal into a digital signal and the controls the input of the DCO. The m-bit output signal of the digital loop filter controls the coarse control capacitor bank, the intermediate control capacitor bank, and the fine control capacitor bank of the DCO, thereby outputting a DCO frequency corresponding to the phase error. As described above, when the DCO frequency continuously changes in accordance with the digital phase error value, consequently, the digital PLL is locked at the frequency set by the frequency setting value.

Referring to FIG. 2, the operational principle of the rising edge retimer 106 and the falling-edge retimer 107 is illustrated. In FIG. 2, 'CKV' indicates a DCO clock, 'FREF' indicates a reference clock, 'pCKR' indicates a rising-edge retimed clock, and 'nCKR' indicates a falling-edge retimed clock.

The rising-edge retimer 106 and the falling-edge retimer 107 may be configured by D-flip-flops such that clock pulses are inverted to each other and applied, and the output is synchronized with the rising-edges and the falling-edges of the clock pulses.

The rising-edge retimed clock pCKR and the falling-edge retimed clock nCKR are clocks obtained by synchronizing the reference clock FREF to the rising- and falling-edges of the DCO clock CKV. The rising-edge retimed clock pCKR is used as a clock for fitting the synchronization of signal flow in the digital PLL and sampling the phase of the delayed reference clock and the falling-edge retimed clock nCKR is used as a sampling clock of the first sampler 102 to calculate one cycle of the DCO clock CKV, that is, the DCO clock cycle $T_v$.

When the clock scheme illustrated in FIG. 2 is used, the operational difference between the time-to-digital converter 100 according to an embodiment of the present invention and a time-to-digital converter used in the related art is as follows.

The digital PLL uses a time-to-digital converter to detect the fine phase difference between the reference clock FREF and the DCO clock CKV. In this case, the time-to-digital converter of the related art uses the two clocks as input in order to detect the fine phase difference between the reference clock and the DCO clock. That is, the phase difference between two clock signals are detected as a digital value through the pseudo-thermometer code edge detector by inputting the DCO clock CKV to the coarse delay cell and inputting the reference clock FREF to the sampler configured by a D-flip-flop. For example, the coarse delay cell is driven by a high-frequency DCO clock of 2.2 GHz, such that power consumption and noise are large.

On the contrary, the time-to-digital converter 100 according to an embodiment of the present invention illustrated in FIG. 1 can input a reference clock of 30 MHz to the coarse delay cell 101, such that it is possible to reduce power consumption and also reduce phase noise by detecting a fine phase error that cannot be detected from the coarse delay cell 101 by the residual error detector 200. Since the power in most digital PLLs is consumed by the time-to-digital converter and the DCO, reducing power consumption by the time-to-digital converter reduces the entire power consumption of the digital PLL.

In this case, the reason that the time-to-digital converter 100 according to an embodiment of the present invention can detect a phase error in the same way as the time-to-digital converter of the related art is because, as described above, the retimed reference clocks pCKR/nCKR are synchronized with the DCO clock CKV. Therefore, the fractional phase error $\epsilon$ between the reference clock FREF and the DCO clock CKV and the fractional phase error $\epsilon$ between the reference clock FREF and the rising-edge retimed clock pCKR are the same.

A method of detecting the fractional phase error $\epsilon$ in the time-to-digital converter 100 according to the present invention is described with reference to FIG. 5.

When a reference clock is input to the coarse delay cell 101 and the reference clock is delayed by the delay time of one delay cell along the delay cell, the reference clock is transmitted while being delayed by one inverter delay time, as illustrated in FIG. 5. The value of the delayed reference clock FREF is sampled by using a D-flip-flop at the rising-edge of the rising-edge retimed clock pCKR. The value of the delayed reference clock FREF is sampled by using a D-flip-flop at the rising-edge of the falling-edge retimed clock nCKR.

As illustrated in FIG. 5, the number of 1s (eight in FIG. 5) until the value of the reference clock FREF with the sampled value changes to "0" from "1" is the value of the rising-edge fractional phase error $\epsilon$ and this corresponds to the time difference between the rising-edge of the rising-edge retimed clock pCKR and the rising-edge of the reference clock FREF. That is, it is the phase difference between the DCO clock CKV and the reference clock FREF.

The $T_v$ value can be calculated by measuring the falling-edge fractional phase error $\Delta\tau_N$ corresponding to the time difference between the rising-edge of the reference clock FREF and the rising-edge of the falling-edge retimed clock nCKR by using the falling-edge retimed clock in order to normalize the fractional phase error to the DCO clock cycle $T_v$.

Further, the residual phase error $\epsilon_r$ is calculated by detecting the residue time $\tau_r$, which cannot be detected by the coarse delay cell 101 through the residual error detector 200, by using the fine delay cell 201 illustrated in FIG. 3, and then by adding the residual phase error to the coarse phase error $\epsilon_c$, as illustrated in FIG. 1, it is possible to more precisely calculate the fractional phase error $\epsilon$.

The residual error detector 200 is a part for detecting the residual phase error $\epsilon_r$ in the time-to-digital converter 100. Referring to FIG. 3, the residual error detector 200 includes a fine delay cell 201, a second sampler 202, a coarse delay time detector 203, a residue time detector 204, and a multiplier 205.

The inverter in the fine delay cell 201, having a predetermined delay time $\tau_f$, is constituted by a delay buffer chain connected with a plurality of (M in the present embodiment) delay buffers (delay cells) in series, and the coarse delay cell 101 outputs signals T[0]~T[M] delayed by a predetermined delay time (one delay buffer time) to the reference clock FREF by receiving the reference signal FREF and sequentially passing the delay buffers.

The first sampler 202 is a sampling register and includes a plurality of flap-flops that latches the outputs T[0]~T[M] of the delay cells. The plurality of flip-flops may each be implemented by a D-flip-flop and are composed of M, the same number of the inverters included in the fine delay cell 201, that is, 2M D-flip-flops.

The coarse delay time detector 203 detects the phase difference between the reference clock FREF from the signal output from the second sampler 202 and the reference clock signal C[0] delayed by $\tau_c$ through the first buffer of the coarse delay cell 101.

Two pairs of the fine delay cell and the second sampler 202 exist in the same configuration and the second group is used to detect the residue time.

The selection signal Sel illustrated in FIG. 3 is generated from the pseudo-thermometer code edge detector 103 illustrated in FIG. 1 and is a signal showing the time point for detecting the residual phase error, and the residue time $\tau_r$ starts to be detected by triggering the reference clock FREF through an AND gate. The triggered reference clock FREF0 is inputted to the fine delay cell 102 and transmitted, as illustrated in FIG. 7, and is sampled through the second sampler 202 at the rising-edge of the rising-edge retimed clock pCKR, so that it is possible to measure the residue time $\tau_r$.

That is, the coarse delay time detector 203 detects one buffer of the coarse delay cell 101, that is, the delay time $\tau_c$ of the delay cell, the residue time detector 204 detects the residue time $\tau_r$ between the reference clock and the rising-edge retimed clock, and the residual phase error $\epsilon_r$ is generated by multiplying the delay time by the residue time in the multiplier 205. In this case, it is necessary to detect the delay time $\tau_c$ of the coarse delay cell 101 and normalize the residue time in consideration of magnitude proportion between the change in PVT (process, voltage, temperature) of the fine delay cell 102 and the coarse phase error $\epsilon_c$.

FIG. 6 illustrates a method of detecting the delay time $\tau_c$ of the coarse delay cell 101. The time difference between the reference clock FREF and the reference clock signal D[0] delayed through the first buffer is measured. The reference clock is input to the fine delay cell 201 and transmitted and then sampled through the second sampler 202 by the reference clock FREF0 delayed by one buffer, thereby detecting the delay time $\tau_c$ of one delay cell.

The fine residual phase error $\epsilon_r$ is calculated as in Equation 1 by multiplying the residue time $\tau_r$ by the reciprocal number of the coarse delay time $\tau_c$ detected through the multiplier 205 illustrated in FIG. 3.

$$\epsilon_r = \tau_r / \tau_c \quad \text{[Equation 1]}$$

Further, as illustrated in FIG. 1, the fractional phase error $\epsilon$ and the DCO clock cycle $T_v$ that are calculated by the time-to-digital converter 100 according to an embodiment of the present invention are calculated as in Equations 2 and 3. The fractional phase error $\epsilon$ is normalized to the DCO clock cycle $T_v$ calculated from Equation 3 and output as a normalized phase error $\epsilon nr$ as in Equation 4.

$$\epsilon = \epsilon_c + \epsilon_r \quad \text{[Equation 2]}$$

$$T_v = 2 \times |\epsilon_r - \Delta\tau_N| \quad \text{[Equation 3]}$$

$$\epsilon_{nr} = \epsilon / T_v \quad \text{[Equation 4]}$$

Further, the residual detector 200 may be configured, as illustrated in FIG. 4. The residual error detector 200 illustrated in FIG. 4, is provided with only one of each of the two pairs of the fine delay cells 102 and the second samplers 202 illustrated in FIG. 3 such that the reference clock signal D[0] delayed through the first buffer or the rising-edge retimed clock pCKR is selectively used by the selection signal Sel, as a sampling pulse of the second sampler 202 by using a multiplexer, thereby sequentially detecting the coarse delay time $\tau_c$ and the residue time $\tau_r$ by the coarse delay time and residue time detector 204.

Phase error detection of the time-to-digital converter 100 according to an embodiment of the present invention is described as follows with reference to FIGS. 5 to 7.

The time difference $\epsilon_c$ between the rising-edges of the rising-edge retimed clock pCKR and the reference clock FREF is expressed by the number of 1s until the value of the reference clock FREF changes from "1" to "0", and shown by an integer 8, and it corresponds to the number of inverters, eight, such that the coarse phase error $\epsilon_c$ and the DCO clock cycle $T_v$ are expressed by the number of coarse inverters.

In FIG. 6, the reference clock D[0] delayed by one buffer delay time $\tau_c$ of the coarse delay cell 101 is expressed by the number of 1s until the delayed phase of the reference clock FREF changes from "1" to "0" when being sampled to be six, and similarly, the number of time points where the residue time $\tau_r$ through the residue time detector 204 changes "1" to "0" when the phase of the reference clock FREF0 triggered by the selection signal Sel is sampled to the rising-edge retimed clock pCKR becomes three.

Therefore, the normalized fine residual phase error $\epsilon_r$ becomes 0.5(3/6) through Equation 1 in the embodiment described above and the fractional phase error becomes 8.5 (=8+0.5) by Equation 2.

The time difference $\Delta\tau_N$ between the reference clock and the falling-edge retimed clock nCKR is the number of 1s, that is, 2, at the time point where the phase of the transmitted reference clock transits from "1" to "0" when being sampled to the falling-edge retimed clock, such that the DCO clock cycle is calculated to be 12(=2×(8−2)) through Equation 3. The value of the normalized fractional phase error $\epsilon nr$ calculated through Equation 4 by using the DCO clock cycle calculated in the embodiment described above becomes 0.708 (=8.5/12).

The time-to-digital converter of the related art needs the number of inverters corresponding to two cycles (2×$T_v$) of the DCO clock, whereas the time-to-digital convert of the present invention is further provided with one or more to the number of inverters corresponding to the maximum one cycle, such that the number of inverters decreases to the half the number of inverters of the time-to-digital converter of the related art.

According to the present invention, a time-to-digital converter configured to a fine phase error between the DCO clock signal and the reference clock by using the retimed reference signal with the reference frequency synchronized to the DCO clock frequency in a digital PLL is proposed, and the phase error detection resolution is increased by mounting a residual detector equipped with a delay cell having small delay time to improve the inband phase noise.

As described above, since the time-to-digital converter is divided into a coarse delay cell and a fine delay cell, a phase error is coarsely detected in a detection mode using the coarse delay cell and a residual phase error or residue time is finely detected in a detection mode using the fine delay cell. The residue time detector used at this time maximally reduce the phase error by detecting a fine phase error that cannot be detected by the time-to-digital converter in the coarse mode. Further, since the coarse delay time detector for detecting the delay time for one buffer of the coarse delay cell is disposed in the residual error detector, the residue time is made insensitive to changes in PVT environment by being normalized by the coarse delay time. Therefore, the present invention implements power consumption and phase error detection resolution, in comparison to the time-to-digital converter of the related art.

The present invention may be configured to have power consumption and noise contribution which are significantly smaller than those of the existing time-to-digital converters by operating the frequency of a reference clock, and to be able to be used for a low-power and low-nose frequency synthesizer that can be provided for a mobile communication terminal under severe regulations because noise is reduced by using a delay cell with a small delay time.

Further, the present invention improves phase error detection resolution by being divided into a coarse delay cell and a fine delay cell such that a phase error is coarsely detected in a detection mode using the coarse cell and a residual phase error or residual time in a detection mode using the fine delay cell.

Although the present invention has been described with reference to the embodiments illustrated in the drawings, those are only examples and may be changed and modified into other equivalent embodiments from the present invention by those skilled in the art. Therefore, the technical protection scope of the present invention should be determined by the following claims.

What is claimed is:

1. A low-power high-resolution time-to-digital converter comprising:
   a coarse delay cell configured to delay a reference clock by a coarse delay time and output the reference clock;
   a rising-edge retimer configured to output a rising-edge retimed clock synchronized with the rising-edge of a DCO (Digitally Controlled Oscillator) clock in response to the reference clock;
   a falling-edge retimer configured to output a falling-edge retimed clock synchronized with the falling-edge of the DCO clock in response to the reference clock;

a first sampler configured to latch output of the coarse delay cell in response to the rising-edge retimed clock and the falling-edge retimed clock; and a pseudo-thermometer code edge detector configured to detect a rising-edge fractional phase error between the reference clock and the rising-edge retimed clock as a coarse phase error from a signal output by the first sampler, and detect a falling-edge fractional phase error between the reference clock and the falling-edge retimed clock.

2. The low-power high-resolution time-to-digital converter of claim 1, wherein the first sampler includes a plurality of D-flip-flops each responding to the rising-edge retimed clock and the falling-edge retimed clock, and the pseudo-thermometer code edge detector converts the rising-edge fractional phase error and the falling-edge fractional phase error into digital code values corresponding to the number of D-flip-flops that have latched in the plurality of D-flip-flops.

3. The low-power high-resolution time-to-digital converter of claim 1, wherein the pseudo-thermometer code edge detector generates a selection signal showing a residue time detection time point by using the rising-edge fractional phase error and the falling-edge fractional phase error.

4. The low-power high-resolution time-to-digital converter of claim 3, further comprising a residual error detector configured to detect a fine phase error between the reference clock and the rising-edge retimed clock at the time point where the selection signal is generated.

5. The low-power high-resolution time-to-digital converter of claim 4, wherein the residual error detector includes:

a coarse delay time detector configured to detect the coarse delay time by using the reference clock and a reference clock delayed by a coarse delay time of the coarse delay cell; and a residue time detector configured to detect a residue time difference between the reference clock and the rising-edge retimed clock, wherein the residual error detector normalizes the residue time based on the coarse delay time.

6. The low-power high-resolution time-to-digital converter of claim 5, wherein the residue time detector detects the residue time from the time point where the selection signal is input from the pseudo-thermometer code edge detector.

7. The low-power high-resolution time-to-digital converter of claim 4, wherein the residual error detector includes a coarse delay time and residue time detector provided with a built-in pseudo-thermometer code configured to calculate first the coarse delay time and then calculate the residue time or simultaneously calculate the coarse delay time and the residue time in accordance with the logic state of the selection signal showing the detection time point of the residue time in order to detect the fine phase error between the reference clock and the rising-edge retimed clock.

8. The low-power high-resolution time-to-digital converter of claim 4, further comprising:

a DCO cycle detector configured to calculate a DCO clock cycle by detecting a difference between the rising-edge fractional phase error and the falling-edge fractional phase error; and a normalizing block configured to normalize a fractional phase error obtained by adding the coarse phase error to the fine phase error by using the DCO clock signal.

* * * * *